(12) United States Patent
Guo

(10) Patent No.: US 8,054,122 B2
(45) Date of Patent: Nov. 8, 2011

(54) ANALOG SWITCH WITH A LOW FLATNESS OPERATING CHARACTERISTIC

(75) Inventor: Dianbo Guo, Singapore (SG)

(73) Assignee: STMicroelectronics Asia Pacific Pte Ltd (SG), Singapore (SG)

( * ) Notice: Subject to any disclaimer, the term of this patent is extended or adjusted under 35 U.S.C. 154(b) by 15 days.

(21) Appl. No.: 12/633,777

(22) Filed: Dec. 8, 2009

(65) Prior Publication Data
US 2011/0133813 A1   Jun. 9, 2011

(51) Int. Cl.
*H03L 5/00* (2006.01)
(52) U.S. Cl. .......... 327/333; 327/434; 327/436; 333/103
(58) Field of Classification Search .............. 327/333, 327/434, 436; 333/103
See application file for complete search history.

(56) References Cited

U.S. PATENT DOCUMENTS

| | | | |
|---|---|---|---|
| 5,563,545 A * | 10/1996 | Scheinberg | 327/389 |
| 5,774,792 A * | 6/1998 | Tanaka et al. | 455/78 |
| 5,818,283 A * | 10/1998 | Tonami et al. | 327/436 |
| 6,154,085 A | 11/2000 | Ramakrishnan | |
| 6,194,952 B1 * | 2/2001 | Shigehara | 327/534 |
| 6,335,653 B1 | 1/2002 | Shigehara et al. | |
| 6,462,611 B2 * | 10/2002 | Shigehara et al. | 327/534 |
| 6,492,860 B1 | 12/2002 | Ramakrishnan | |
| 7,385,433 B2 * | 6/2008 | Callahan, Jr. | 327/534 |
| 7,514,983 B2 * | 4/2009 | Miske | 327/534 |
| 2001/0040479 A1 * | 11/2001 | Zhang | 327/427 |
| 2004/0196089 A1 | 10/2004 | O'Donnell et al. | |

\* cited by examiner

*Primary Examiner* — Kenneth B. Wells
(74) *Attorney, Agent, or Firm* — Andre M. Szuwalski; Gardere Wynne & Sewell LLP

(57) ABSTRACT

An analog switch includes a transistor whose source connected to a signal input and whose drain is connected to a signal output. An output of a gate control circuit is connected to the transistor gate. A first input of the gate control circuit is connected to the source of the transistor. The gate control circuit responds to a logic transition of an enable signal received at a second input by pre-charging a substantially constant gate-to-source voltage across the transistor. This voltage is stored by a gate-to-source connected capacitor. In one steady-state logic condition of the enable signal, the gate control circuit operates to turn off the transistor. In another steady-state logic condition of the enable signal, the gate control circuit permits the signal received at the signal input to drive the gate of the transistor with a voltage offset by the substantially constant gate-to-source voltage stored on the capacitor.

19 Claims, 2 Drawing Sheets

ANALOG SWITCH WITH A LOW FLATNESS OPERATING CHARACTERISTIC

BACKGROUND OF THE INVENTION

1. Technical Field of the Invention

The present invention relates generally to analog switches, and more particularly to MOS analog switches.

2. Description of Related Art

Reference is now made to FIG. 1 which shows a schematic diagram of a prior art MOS analog switch 10. The switch 10 is formed from an NMOS transistor 12 and a PMOS transistor 14 that are connected in parallel. More specifically, the source of the NMOS transistor 12 is connected to the drain of the PMOS transistor 14 (at node 16), and the drain of the NMOS transistor 12 is connected to the source of the PMOS transistor 14 (at node 18). The input signal at the terminal IN is applied to node 16 and the output signal at the terminal OUT is taken from node 18. A control signal at the terminal CONTROL is applied to gate of NMOS transistor 12, while the complement of the control signal is applied to the gate of the PMOS transistor 14 through the operation of an inverter 20. When the control signal is logic low, the NMOS transistor 12 and PMOS transistor 14 are both turned off so as to isolate the input terminal IN from the output terminal OUT. When the control signal is logic high, however, the NMOS transistor 12 and PMOS transistor 14 are both turned on, and a signal at the input terminal IN is coupled by the analog switch 10 to the output terminal OUT.

The analog switch 10 is used in many applications. For example, the switch 10 is used in audio applications to control passage of an analog audio signal from IN to OUT. When used in audio applications, however, it is important that the analog switch 10 exhibit a low flatness characteristic. "Flatness" refers to the difference between the maximum value of on-resistance for the switch 10 and the minimum value of on-resistance for the switch 10 over a range of voltage input levels. The lower the flatness (i.e., the more flat the on-resistance of the switch 10 as a function of input voltage), the better; especially in audio applications where flatness can be correlated to sound quality (and non-flatness correlated to signal distortion). The circuit of FIG. 1 does not exhibit a flatness which is acceptable for many audio (and other) applications.

Reference is now made to FIG. 2 which shows a schematic diagram of a prior art MOS analog switch 50 (as taught by U.S. Pat. No. 6,154,085, the disclosure of which is hereby incorporated by reference). The switch 50 has an improved low flatness operating characteristic in comparison to switch 10 of FIG. 1. This is accomplished by regulating the gate voltage according to the signal source. First NMOS transistor 52 has its source coupled to the input terminal IN, and its drain coupled to the output terminal OUT. Second NMOS transistor 54 has its source coupled to the input terminal IN and its drain coupled to node 56. Third NMOS transistor 58 has its source coupled to the node 56 and its drain coupled to the output terminal OUT. A control signal at the terminal CONTROL is applied to the gates of transistors 52, 54 and 58. Node 56 is further coupled to the bulk terminals (substrate wells) of transistors 52, 54 and 58. The switch 50 further includes a level shifter 60 whose input is coupled to the node 56 and whose output is coupled to the gates of transistors 52, 54 and 58 through an optional resistor 62.

When the switch 50 is turned on by the control signal, the circuit functions to provide a constant gate drive to NMOS transistor 52, regardless of the input signal received at terminal IN, in order to maintain a substantially constant on-resistance for the switch 50 (i.e., achieve low flatness). The level shifter 60 accomplishes this by providing a constant gate-to-source voltage relative to the midpoint of the source-to-drain voltage of transistor 52. The transistors 54 and 58 provide a voltage at node 56 which is at the midpoint between the source voltage and drain voltage of transistor 52. The level shifter 60 shifts the signal voltage at the input terminal IN by an amount equal to the desired gate-to-source voltage of the transistor 52, and provides the fixed gate-to-source voltage with respect to the source-to-drain voltage.

There are limitations with respect to the switch 50 of FIG. 2. The level shifter 60 requires a constant current to operate (see, '085 patent, FIG. 3), and this not preferred in battery powered (for example, mobile) applications. Additionally, if the input signal at terminal IN goes to far negative (for example, −1 Volt), the output of the level shifter 60 will be clamped to zero volts.

There is accordingly a need in the art for an improved analog switch exhibiting a low flatness operating characteristic and suitable for use in battery powered applications.

SUMMARY OF THE INVENTION

In an embodiment, a circuit comprises: a first transistor coupled between a signal input and an output; a second transistor coupled between the signal input and a node; a third transistor coupled between the node and the output; and a gate control circuit having an output coupled to the gates of the first, second and third transistors, and having a first input coupled to the signal input, the gate control circuit comprising a capacitor coupled across the gate-to-source of the first transistor between the first input and the output of the gate control circuit, wherein a voltage stored across the capacitor sets a substantially constant gate-to-source voltage of the first transistor regardless of a signal at the signal input.

In another embodiment, a circuit comprises: a first transistor having a source coupled to a signal input, a drain coupled to a signal output, and a gate; and a gate control circuit having an output coupled to the gate of the first transistor, and having a first input coupled to the source of the first transistor, the gate control circuit adapted to provide a substantially constant voltage difference between the gate and source of the first transistor and further lacking a static discharge path.

In an embodiment, a circuit comprises: a first transistor coupled between a signal input and a signal output; a second transistor coupled between the signal input and a node; a third transistor coupled between the node and the signal output; and a gate control circuit having a first input adapted to receive an enabling control signal, an output coupled to the gates of the first, second and third transistors, and a second input coupled to the signal input, the gate control circuit operable in response to a logic transition of the enabling control signal to pre-charge a substantially constant gate-to-source voltage across the first transistor.

In another embodiment, a circuit comprises: a first transistor having a source connected to a signal input, a drain connected to a signal output, and a gate; and a gate control circuit having an output connected to the gate of the first transistor, and having a first input connected to the source of the first transistor, the gate control circuit operable in response to a logic transition of an enabling control signal at a second input to pre-charge a substantially constant gate-to-source voltage across the first transistor.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 3:
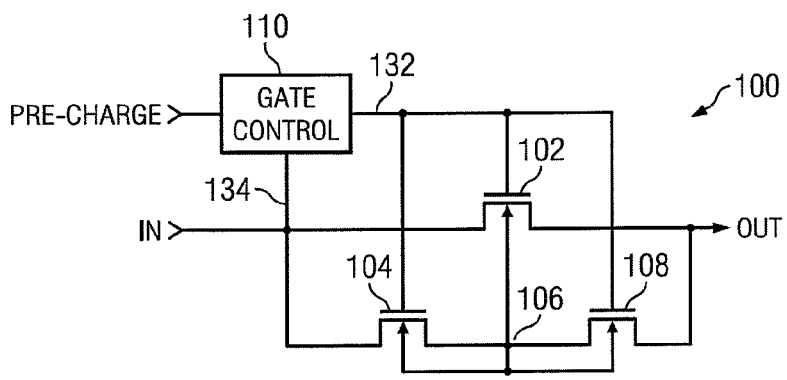
FIG. 3 is a schematic diagram of an analog switch embodiment.

Reference is now made to FIG. 3 which shows a schematic diagram of an analog switch 100 embodiment. First NMOS transistor 102 has its source coupled to the input terminal IN, and its drain coupled to the output terminal OUT. Second NMOS transistor 104 has its source coupled to the input terminal IN and its drain coupled to node 106. Third NMOS transistor 108 has its source coupled to the node 106 and its drain coupled to the output terminal OUT. Node 106 is further coupled to the bulk terminals (substrate wells) of transistors 102, 104 and 108.

A pre-charge (enable) signal received at the terminal PRE-CHARGE is applied to a first input of a gate control circuit 110. The gate control circuit 110 has an output 132 coupled to the gates of transistors 102, 104 and 108 and a second input 134 coupled to the input terminal INPUT. The pre-charge (enable) signal controls whether the analog switch 100 is enabled or disabled for operation to pass a signal from the input terminal IN to the output terminal OUT. If the pre-charge (enable) signal is in a state (for example, logic low) indicative of a disable condition, the gate control circuit 110 will turn off the transistors 102, 104 and 108. Conversely, if the pre-charge (enable) signal is in a state (for example, logic high) indicative of an enable condition, the gate control circuit 110 establishes a substantially constant voltage difference between the gate (at output 132) and source (at second input 134 and input terminal IN) of the transistor 102. This substantially constant voltage difference between the gate and source of the transistor 102 is provided regardless of the voltage difference between the source (at second input 134 and input terminal IN) and drain (at output terminal OUT) of the transistor 102.

Figure 4:
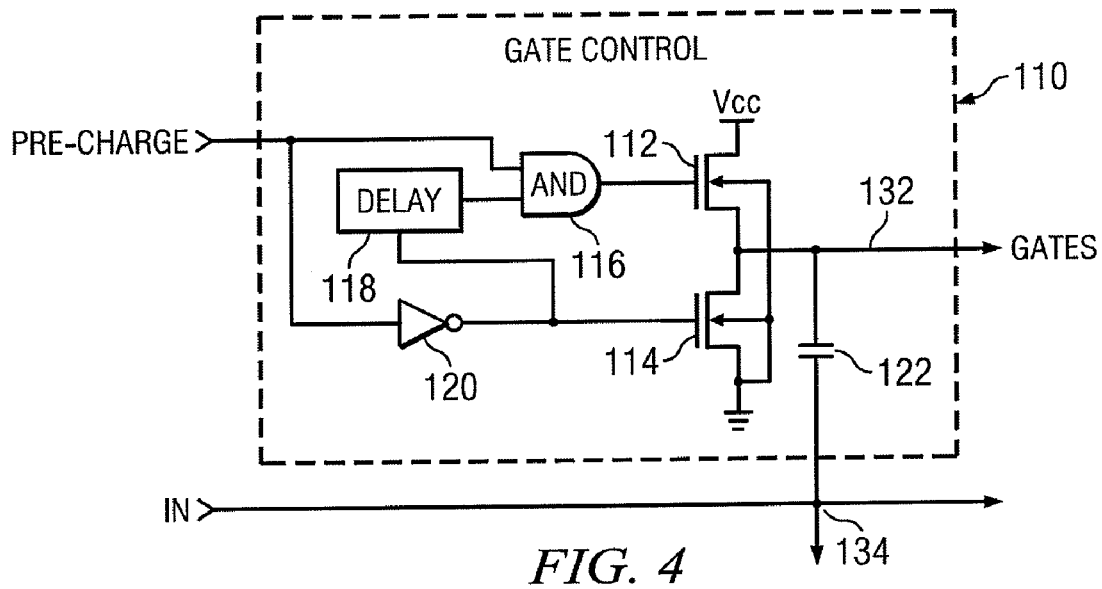
FIG. 4 is a schematic diagram of a gate control circuit for use with the analog switch embodiment of FIG. 3.

Reference is now made to FIG. 4 which shows a schematic diagram of the gate control circuit 110 for use with the analog switch of FIG. 3. A fourth NMOS transistor 112 is coupled in series with a fifth NMOS transistor 114 between a reference voltage node Vcc and a ground node. Specifically, the drain of fourth transistor 112 is coupled to the reference voltage node Vcc and the source of fourth transistor 112 is coupled to the gate control node (GATES). The drain of fifth transistor 114 is coupled to the gate control node (GATES) and the source of fifth transistor 114 is coupled to the ground node. The gate of fourth transistor 112 is coupled to the output of an AND logic gate 116. A first input of the exclusive-OR logic gate 116 is coupled directly to the terminal PRE-CHARGE, while a second input of the exclusive-OR logic gate 116 is coupled indirectly to the terminal PRE-CHARGE through a delay circuit 118 and an inverter 120. The gate of fifth transistor 114 is coupled indirectly to the terminal PRE-CHARGE through the inverter 120. A capacitor 122 is coupled between the gate control node (GATES) at the output 132 and the input terminal IN at the second input 134. Thus, the capacitor 122 is connected across the gate-to-source of the transistors 102 and 104. The capacitor 122 is provided in addition to any parasitic gate-to-source capacitance of the transistor 102 (or transistor 104). As an example, the capacitor 122 may have a capacitance in the range of a few picofarads for typical audio applications.

When the signal at terminal PRE-CHARGE is in a state (for example, a logic low steady state condition) indicative of a disable condition, the switch 100 of FIG. 3 is disabled. The gate of fourth transistor 112 is driven low by AND logic gate 116, and the gate of fifth transistor 114 is driven high by inverter 120. Thus, transistor 112 is off and transistor 114 is on, and the output 132 is grounded. This drives the gate control node (GATES) low, discharges the capacitor 122, and turns off transistors 102, 104 and 108 in the switch 100.

When the signal at terminal PRE-CHARGE is in a state (for example, a logic high steady state condition) indicative of an enable condition, the switch 100 of FIG. 3 is enabled. The gate of fifth transistor 114 is driven low by inverter 120. This turns off transistor 114. Additionally, after a delay period discussed in detail below, the gate of fourth transistor 112 is driven low by AND logic gate 116. This turns off transistor 112. In this condition, the capacitor couples the source of the transistor 102 (at second input 134) to the gate of the transistor 102 (at output 132). In this configuration, the signal received at input terminal IN is used to drive the gate of transistors 102, 104 and 108 (the voltage of the input signal being offset by any voltage across the capacitor 122 which defines the gate-to-source voltage of transistor 102). Since the voltage across the capacitor 122 (defining the gate-to-source voltage of transistor 102) is substantially constant, the on-resistance of the transistor 102 will likewise be substantially constant. In view of this substantially constant gate-to-source voltage for transistor 102, there exists a low flatness operating characteristic for the switch 100.

In this context, the voltage across the capacitor 122 is considered to be "substantially constant" if that voltage varies little, if at all, over a period time in which input signals at terminal IN are being passed to the output terminal OUT (while the signal at terminal PRE-CHARGE is in a state indicative of an enable condition). A "substantially constant" voltage may also be evidenced by the existence of a substantially flat (constant) on-resistance for the transistor 102 (between IN and OUT) over widely varying voltages of the input signal (for example, between ground and Vdd).

We now discuss what happens when the signal at terminal PRE-CHARGE transitions from a state (for example, logic low) indicative of a disable condition to a state (for example, logic high) indicative of an enable condition. The AND logic gate 116 and delay circuit 118 respond to the transition from logic low to logic high at terminal PRE-CHARGE by generating a short logic high pulse at the gate of transistor 112. This pulse will turn on transistor 112 for a short period of time defined by the length of the delay introduced by delay circuit 118. It will be remembered that transistor 114 is turned off by the logic high signal at the terminal PRE-CHARGE. While transistor 112 is turned on, the voltage for the gate control node (GATES) at the output 132 is charged to a pre-charge voltage of Vcc−Vthn (where Vthn is the threshold voltage of transistor 112). This pre-charge voltage produces a voltage across capacitor 122 which defines the substantially constant gate-to-source voltage difference for the transistor 102. For example, the voltage stored across capacitor 122, for Vcc=3.3V, would be 3.3V−0.7V=2.6V.

Since the transistor 102 of FIG. 3 has a substantially constant gate-to-source voltage, regardless of voltage change at the input terminal IN, the switch 100 exhibits a low flatness operating characteristic. Importantly, the gate control circuit 110 does not have a static discharge path, and thus this implementation is well suited for use in battery powered applications. Furthermore, the gate control circuit 110 tracks the input voltage at the input terminal IN through the capacitor 122 and thus is responsive to negative voltages at the input terminal IN.

Figure 5:
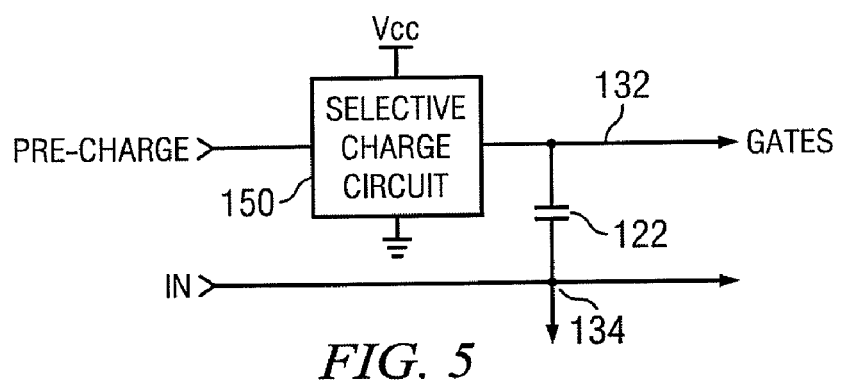
FIG. 5 is a schematic diagram of a gate control circuit for use with the analog switch embodiment of FIG. 3.

The circuit of FIG. 4 is illustrative only, it being understood by those skilled in the art how to configure circuits with equivalent operation. The operational point of the gate control circuit 110 of FIG. 3 is to selectively charge a substantially constant gate-to-source voltage with respect to transistor 102. This is accomplished by charging a voltage across the capacitor 122 which is connected from gate-to-source of transistor 102. FIG. 5 illustrates this using a selective charge circuit 150 which functions responsive to the signal at the terminal PRECHARGE in: a first mode to discharge the voltage on capacitor 122 to ground; a second mode to charge a substantially constant voltage derived from Vcc on the capacitor 122; and a third mode to disconnect Vcc and ground from the output 132 (GATES).

CONCLUSION

Figure 1:
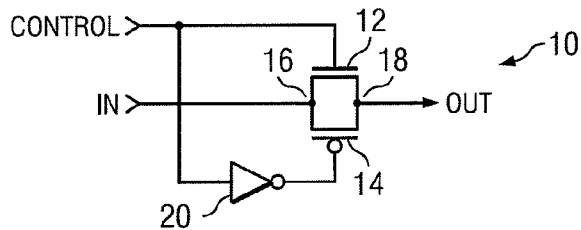
FIG. 1 is a schematic diagram of a prior art MOS analog switch.
Figure 2:
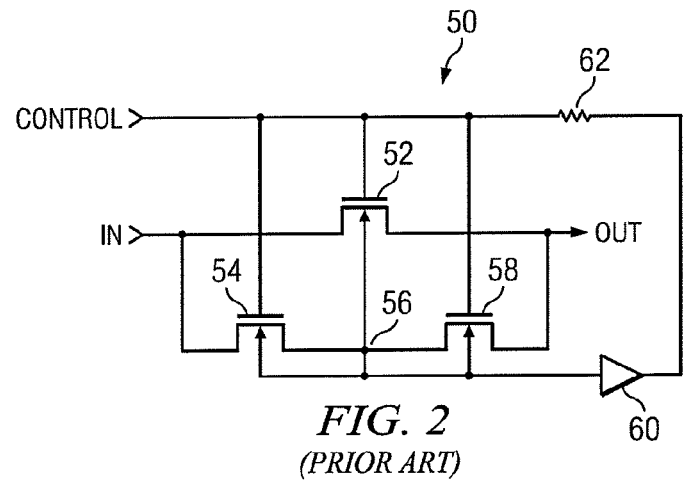
FIG. 2 is a schematic diagram of a prior art MOS analog switch.

In order for an analog switch to achieve low flatness, the transistor gate-to-source voltage must remain substantially constant. The prior art implementation of FIG. 2 level shifts the input signal to provide a constant gate drive signal for the NMOS transistor. This circuit, however, possesses a static current discharge path and cannot work with some negative input signal voltages. The circuit of FIGS. 3 and 4, however, provides an improved gate control circuit. The capacitor 122 is placed between the gate of the NMOS switch transistor and the input terminal IN (the source of the NMOS switch). When the analog switch is initially activated, the capacitor is precharged. Thereafter, with respect to an input signal applied to the input terminal IN, a substantially constant voltage difference will remain present between the NMOS switch transistor gate and source, relative to the drain-to-source voltage, providing a low flatness operating characteristic.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
a first transistor coupled between a signal input and an output;
a second transistor coupled between the signal input and a node;
a third transistor coupled between the node and the output; and
a gate control circuit having an output coupled to the gates of the first, second and third transistors, and having a control input coupled to receive a control signal; and
a capacitor coupled across the gate-to-source of the first transistor between the signal input and the output of the gate control circuit,
the gate control circuit comprising pre-charge circuitry including a delay circuit coupled to the control input and adapted to respond to a change in state of the control signal received at the control input to generate a pulse signal having a pulse duration set by said delay circuit, said pre-charge circuitry operable in response to the pulse signal to couple a first reference voltage to the capacitor for the duration of the pulse signal so as to store a voltage across the capacitor which sets a gate-to-source voltage of the first transistor.

2. The circuit of claim 1 wherein the first, second and third transistors are of the same conductivity type.

3. The circuit of claim 1 further comprising a connection from the node to a bulk of each of the first, second and third transistors.

4. The circuit of claim 1 wherein the delay circuit is adapted to generate the pulse signal when the control signal at the control input changes from a logic state indicating that the first transistor is to be disabled.

5. The circuit of claim 4 wherein the pre-charge circuitry is adapted to couple a second reference voltage to the output of the gate control circuit and the gates of the first, second and third transistors if the control signal at the control input has the logic state indicating that the first transistor is to be disabled.

6. The circuit of claim 1 wherein the delay circuit comprises: a logic gate driven by the control signal at the control input and a delayed version of the control signal at the control input.

7. The circuit of claim 1 further comprising:
a fourth transistor having a gate coupled to receive the control pulse, the fourth transistor adapted to be turned on by the control pulse to momentarily couple the first reference voltage to the capacitor and pass a charging current to the capacitor; and
a fifth transistor coupled in series with the fourth transistor and adapted to be turned on in response to the control signal at the control input so as to turn off the first transistor,
wherein the first, second, third, fourth and fifth transistors are of a same conductivity type.

8. The circuit of claim 1 9 wherein the gate control circuitry is further operable, following termination of the pulse signal after said duration, to disconnect the output of the gate control circuitry from both a high supply voltage node and a low supply voltage node, said high and low supply voltage nodes configured to supply power to said gate control circuitry.

9. A circuit comprising:
a first transistor coupled between a signal input and an output;
a second transistor coupled between the signal input and a node;
a third transistor coupled between the node and the output; and
a gate control circuit having an output coupled to the gates of the first, second and third transistors, the gate control circuit comprising a capacitor coupled across the gate-to-source of the first transistor between the signal input and the output of the gate control circuit, wherein a voltage stored across the capacitor sets a gate-to-source voltage of the first transistor;
wherein the gate control circuit comprises a pre-charge circuit adapted to pre-charge the gate-to-source voltage across the capacitor, the pre-charge circuit including a control input adapted to receive a control signal;
wherein the pre-charge circuit comprises:
a pulse circuit adapted to generate a control pulse in response to the control signal at the control input; and
a fourth transistor having a gate coupled to receive the control pulse, the fourth transistor adapted to be turned on by the control pulse and pass a charging current to the capacitor;

wherein the pulse circuit comprises a logic gate driven by the control signal at the control input and a delayed version of the control signal at the control input.

10. A circuit, comprising:
a first transistor having a source coupled to a signal input, a drain coupled to a signal output, and a gate; and
a gate control circuit having an output coupled to the gate of the first transistor, and having a control input adapted to receive a control signal; and
a capacitance coupled between the signal input and the output of the gate control circuit,
the gate control circuit comprising pre-charge circuitry including a delay circuit coupled to the control input and adapted to respond to a change in state of the control signal received at the control input to generate a signal pulse having a pulse duration set by said delay circuit that couples, for a length of the pulse duration, a first reference voltage to the capacitance to store a voltage across the capacitance.

11. The circuit of claim 10 wherein the capacitance is provided by a capacitor that is coupled between the gate and source of the first transistor.

12. The circuit of claim 11 further comprising a second transistor coupled between the signal input and a node, and a third transistor coupled between the node and the signal output, the second and third transistors having gates which are coupled to the gate of the first transistor.

13. The circuit of claim 11 wherein the gate control circuitry is further operable, following termination of the pulse signal after said duration, to disconnect the output of the gate control circuitry coupled to the gate of the first transistor from both a high supply voltage node supplying the first reference voltage and a low supply voltage node supplying a ground reference voltage, said high and low supply voltage nodes configured to supply power to said gate control circuitry.

14. A circuit, comprising:
a first transistor coupled between a signal input and a signal output;
a second transistor coupled between the signal input and a node;
a third transistor coupled between the node and the signal output; and
a gate control circuit having a control input adapted to receive an enabling control signal, and an output coupled to the gates of the first, second and third transistors; and
a capacitor coupled between the gate and the source of the first transistor,
the gate control circuit operable in response to a logic transition of the enabling control signal from a first logic state to a second logic state to generate a signal pulse, the gate control circuit further comprising a switching circuit operable in response to the enabling control signal in the first logic state to connect the output of the gate control circuit to a low reference voltage node, further operable in response to the signal pulse to connect a high reference voltage node to the capacitor for a length of the signal pulse so as to pre-charge a gate-to-source voltage across the first transistor, and further operable in response to termination of the signal pulse to disconnect the output of the gate control circuit from both the low reference voltage node and the high reference voltage node.

15. The circuit of claim 14 wherein when the output of the gate control circuit is connected to the low reference voltage node, the gates of the first, second and third transistors are coupled to a reference voltage which turns off the first, second and third transistors.

16. A circuit, comprising:
a first transistor having a source connected to a signal input, a drain connected to a signal output, and a gate; and
a gate control circuit having an output connected to the gate of the first transistor, and having a control input adapted to receive an enabling control signal; and
a capacitance coupled between the signal input and the output of the gate control circuit,
the gate control circuit comprising a logic circuit with a delay operable in response to a logic transition of the received enabling control signal to couple a high reference voltage node to the capacitance for a length of the delay so as to pre-charge a gate-to-source voltage across the first transistor, the gate control circuit further operable in response to termination of the delay to disconnect the output of the gate control circuit connected to the gate of the first transistor from both the high reference voltage node and a low reference voltage node, said high and low reference voltage nodes configured to supply power to said gate control circuit.

17. The circuit of claim 16 wherein the capacitance comprises a capacitor connected between the gate and the source of the first transistor to store the gate-to-source voltage.

18. The circuit of claim 16 further comprising a second transistor having a source connected to the signal input, a drain connected to a node and a gate, and a third transistor having a source connected to the node and a drain connected to the signal output and a gate, the gates of the second and third transistors being connected to the gate of the first transistor.

19. The circuit of claim 16 wherein the gate control circuit comprises a pre-charge transistor operable in response to a pulse signal having a length of the delay to couple the high reference voltage node to the capacitance.

* * * * *

UNITED STATES PATENT AND TRADEMARK OFFICE
CERTIFICATE OF CORRECTION

PATENT NO. : 8,054,122 B2  
APPLICATION NO. : 12/633777  
DATED : November 8, 2011  
INVENTOR(S) : Dianbo Guo Page 1 of 1

It is certified that error appears in the above-identified patent and that said Letters Patent is hereby corrected as shown below:

At column 6, claim number 8, line number 37, please delete the number "9".

Signed and Sealed this
Twentieth Day of December, 2011

David J. Kappos
*Director of the United States Patent and Trademark Office*